US008543878B1

(12) United States Patent
Ho et al.

(10) Patent No.: US 8,543,878 B1
(45) Date of Patent: Sep. 24, 2013

(54) APPARATUS AND A METHOD TO TEST A PARAMETRIC STRUCTURE UTILIZING LOGICAL SENSING

(75) Inventors: Eng Ling Ho, Seberang Jaya (MY); Chai Ling Chee, Jalan Van Praagh (MY)

(73) Assignee: Altera Corporation, San Jose, CA (US)

( * ) Notice: Subject to any disclaimer, the term of this patent is extended or adjusted under 35 U.S.C. 154(b) by 145 days.

(21) Appl. No.: 13/284,830

(22) Filed: Oct. 28, 2011

(51) Int. Cl.
*G01R 31/28* (2006.01)

(52) U.S. Cl.
USPC ........................ 714/734; 324/750.01

(58) Field of Classification Search
USPC .................. 438/18, 17; 257/48; 324/754.05, 324/762.01, 750.01; 365/201; 600/347; 714/734
See application file for complete search history.

(56) References Cited

U.S. PATENT DOCUMENTS

| | | | | | |
|---|---|---|---|---|---|
| 5,872,018 | A | * | 2/1999 | Lee | 438/18 |
| 5,977,558 | A | * | 11/1999 | Lee | 257/48 |
| 6,873,167 | B2 | * | 3/2005 | Goto et al. | 324/754.05 |
| 7,385,864 | B2 | * | 6/2008 | Loh et al. | 365/201 |
| 8,110,416 | B2 | * | 2/2012 | Griffin et al. | 438/17 |
| 8,310,265 | B2 | * | 11/2012 | Zjajo et al. | 324/762.01 |
| 2010/0030045 | A1 | * | 2/2010 | Gottlieb et al. | 600/347 |

* cited by examiner

*Primary Examiner* — David Ton
(74) *Attorney, Agent, or Firm* — Womble Carlyle Sandridge & Rice, LLP

(57) ABSTRACT

An apparatus to test a parametric structure utilizing a logical sensing technique is provided. The apparatus includes a device under test (DUT) and tester hardware. The DUT includes a parametric structure that receives a logic signal and transfers the logic signal through the parametric structure to a power pin that is coupled to the parametric structure. The DUT also includes a DFT circuitry that controls a pathway connecting the parametric structure and the power pin. The DFT circuitry gates the logic signal propagation from the parametric structure to the power pin. The tester hardware includes a channel to transfer or receive a logic signal and a power pathway to transfer power to the DUT. The tester hardware also includes a switch to multiplex the power pathway or the channel connections to the power pin.

20 Claims, 6 Drawing Sheets

APPARATUS AND A METHOD TO TEST A PARAMETRIC STRUCTURE UTILIZING LOGICAL SENSING

BACKGROUND

Testing in the integrated circuit (IC) industry is a process of device verification to ensure that an IC is functionally acceptable. The IC industry tests every IC prior to shipping to the customers. In a test process, there are many test methods available to catch various defects introduced from manufacturing processes. The test methods can be classified into two categories, functional testing and parametric testing. Each test method provides data on the functionalities and reliabilities of the IC.

Functional testing verifies that the IC meets expected performance and functionality. During the functional testing, the basic functional properties of the IC is invoked, e.g., storing data into a memory and reading the stored data from the memory, programming Field Programmable Gate Arrays (FPGAs) and invoking functionalities of the programmed FPGA, etc. Parametric testing is a verification of parametric structures within the IC. The parametric testing is utilized to collect data on the process variations and tolerances. Based on information gathered through the parametric testing, the IC's reliability is established. The parametric testing includes testing of resistance, capacitance or inductance of a parametric structure.

For the parametric testing, a parametric measurement unit (PMU) is used to test the structures. The PMU transfers a voltage into the IC and measures the current. The current is either being drawn or leaked from the PMU to the IC. In order to force a voltage into the IC, the voltage needs to be either ramped or de-ramped gradually to a certain level by the PMU before forcing the voltage into the IC. Ramping or de-ramping of a voltage incurs a significant amount of add-on test time. An example of a relatively high add-on test time occurs when a tester having a single PMU tests an IC having multiple parametric structures. The single PMU will be required to either ramp up or ramp down the voltage level to test each of the parametric structures. Such activity incurs high costs in part due to the high test time. Furthermore, as the IC devices are becoming larger in terms of size and complexity, the numbers of the structures in the ICs are increasing. Therefore, as each generation progresses, the cost to test the IC increases.

It is within this context that the embodiments described herein arise.

SUMMARY

Embodiments of present invention provide an IC, a system and a method to test a parametric structure utilizing logical sensing.

It should be appreciated that the present embodiment can be implemented in numerous ways, such as a process, an apparatus, a system, a device, or a method. Several embodiments are described below.

In one embodiment, a method to test a parametric property of an IC is described. The method includes receiving a logic signal at the IO pin of the IC. The logic signal is then transferred to a parametric structure, to test a parametric property. The logic signal is affected in terms of voltage level or current level when transferred across the parametric structure. Next, a design-for-test (DFT) circuit enables the logic signal to be propagated from the parametric structure to a power pin. The logic signal is transmitted from the power pin of the IC into a tester for verification of the parametric structure.

In another embodiment, a system to test the parametric property of an IC is described. The system includes a device under test (DUT) and tester hardware. The DUT includes a parametric structure that receives a logic signal and transfers the logic signal to the parametric structure. The DUT also includes a power pin that is coupled to the parametric structure in the IC. The power pin transfers the logic signal out of the IC. The DUT also includes DFT circuitry placed on a pathway that couples the parametric structure to the power pin. The DFT circuitry gates the logic signal propagation. The tester hardware provides an interface between the IC and a tester. The tester hardware includes a channel that transfers the logic signal to the tester and a power pathway to transfer power to the DUT. The tester hardware also includes a switch that enables multiplexing either the power pathway or the channel to the power pin of the IC.

BRIEF DESCRIPTION OF THE DRAWINGS

The embodiment may be understood by reference to the following description taken in conjunction with the accompanying drawings.

DETAILED DESCRIPTION

The following embodiments describe an IC, a system and a method to test a parametric structure utilizing logical sensing. It will be obvious, however, to one skilled in the art, that the present embodiments may be practiced without some or all of these specific details. In other instances, well-known operations have not been described in detail in order not to unnecessarily obscure the embodiments.

The embodiments described below illustrate a method to test a parametric structure utilizing logical sensing. The method to test a parametric structure utilizing a logical sensing is based on digital electronic testing techniques, wherein a logic one or a logic zero signal is transmitted into the IC and a logic one or a zero signal is received from the IC for verification. The method can be applied for a functional test or a parametric test depending on the testing setup. The method to test the parametric structure utilizing the logical sensing technique reduces test time and test cost relative to current testing methodologies. The embodiments also describe an IC and a testing system to enable the method to test the parametric structure utilizing logical sensing.

Figure 1:
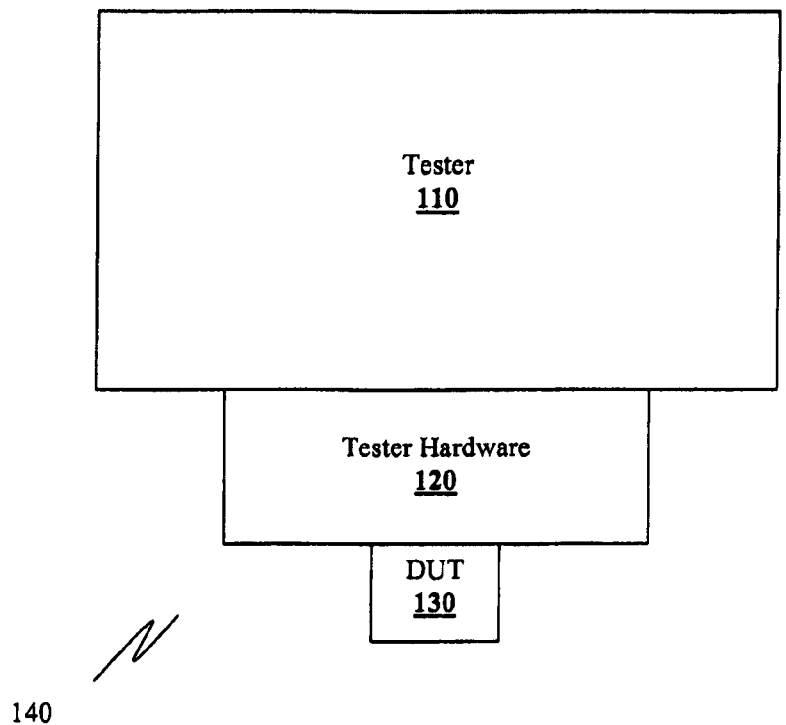
FIG. 1, meant to be illustrative and not limiting, illustrates a system to test an IC in accordance with one embodiment.

FIG. 1, meant to be illustrative and not limiting, illustrates a system to test an IC utilizing a logical sensing method. The system 140 includes a tester 110, a test hardware 120 and a device-under-test (DUT) 130. The tester 110 is connected to the DUT 130 through the test hardware 120. In one embodiment, the DUT 130 is one of a memory IC, a programmable IC or a microprocessor IC. It should be noted that, the DUT 130 may be any suitable IC. A person skilled in the art appreciates that the system 140 can be utilized for testing either a single DUT 130 or a plurality of DUTs 130. The plurality of DUTs 130 can be tested utilizing one of a parallel, a sequential or a combination of parallel and sequential testing sequences. The tester 110 is an apparatus that either drives in a power signal and/or a logic signals into the DUT 130. The tester 110 also determines whether to pass or to fail the DUT 130 based on whether the output of DUT 130 meets predefined testing expectations. The tester 110 has plurality of driver channels, JO channels and power channels. In one embodiment, the tester 110 includes a parametric measurement unit (PMU). The PMU drives a current or voltage to the DUT 130 and measures the current or voltage returned from the DUT 130. The tester 110 may be any commercially available tester employed in the IC industry.

Still referring to FIG. 1, the tester hardware 120 is customized hardware that provides an interface to the tester 110 and DUT 130. The tester hardware 120 includes electrical routings, switches and contact pins. The electrical routings carry signals from the driver or JO channel in the tester 110 to the contact pins located on the test hardware 120. The contact pins on the tester hardware 120 connect the electrical routings to a pad or pads on the DUT 130. The switches in the test hardware 120 provide an additional level of logic to test the DUT 130. The switches may function to multiplex two different resources of the tester 110 to one pad on the DUT 130 or to multiplex one resource from the tester 110 to multiple pads on the DUT 130. It should be appreciated that different tests utilize different resources of the system 140. A logical test utilizes logic channels and power channels of the tester 110 to verify the DUT 130 is logically functional. Parametric testing utilizes the PMU of the tester 110 to verify a parametric property of the DUT 130. In one embodiment, the test hardware 120 and the DUT 130 are designed to capture the parametric property utilizing the logic channels and the power channels of the tester 110.

Figure 2:
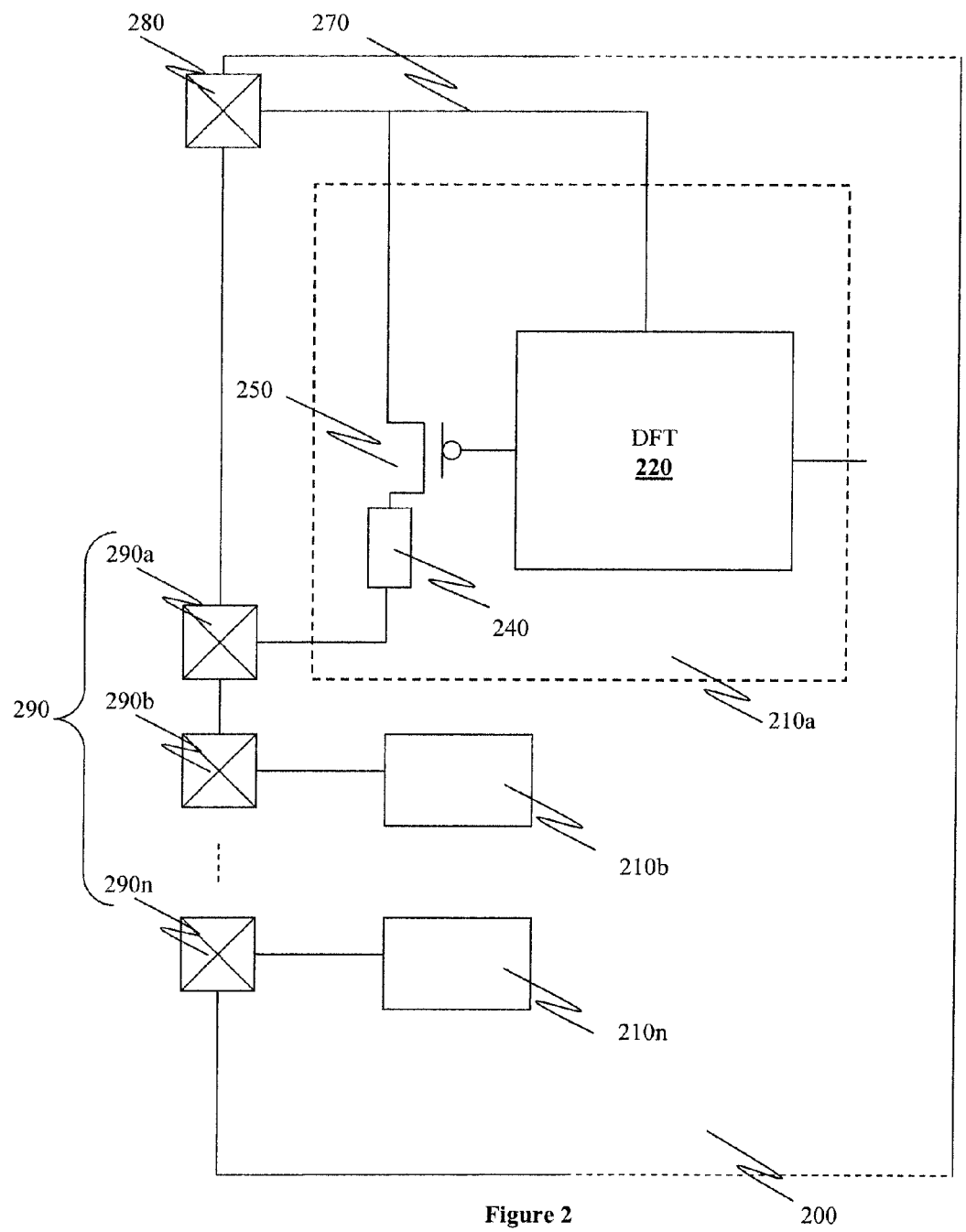
FIG. 2, meant to be illustrative and not limiting, illustrates an IC enabled for testing a parametric property utilizing logical sensing in accordance with one embodiment.

FIG. 2, meant to be illustrative and not limiting, illustrates an IC tested for a parametric property utilizing logical sensing. The IC 200 includes circuits that enable testing the parametric property of the parametric structure located in the IC 200 utilizing a logical sensing method. The IC 200 includes a power pin 280, a plurality of IO pins 290, and a plurality of IO circuits 210a-n. In one embodiment, the power pin 280 of the IC 200 is a power supplying pathway for the IC 200. The power pin 280 is may be VCC, VCCN, VCCQ or VCCP pins, which supply a certain voltage level. The power supplying pathway connects the power supply to different parts of the IC 200. The plurality of IO pins 290 includes individual IO pins such as IO pin 290a-290n. Each IO pin 290a-290n is in communication with an IO circuitry 210a-210n. It should be appreciated that the number of IO pins should not be limited to any specific amount. Each of the IO circuitry 210a-210n is connected to a power pin, e.g. the power pin 280. A pin includes a pad, a bump or other suitable means of transferring a signal into and out of the IC 200. Each of the IO pins 290a-290n provides an interface to an external signal source so that a signal can be transferred into the IC 200. The IO circuitries 210a-210n connects to a pathway 270 leading to the power pin 280.

Still referring to FIG. 2, each of the IO circuits 210a-210n includes a parametric structure 240, a transistor 250 and a design for test (DFT) circuitry 220 as illustrated for IO circuit 210a. The parametric structure 240 is a structure that is tested utilizing logical sensing, as described herein. In this embodiment, the parametric structure can be used for a monitoring purpose of a manufacturing process, wherein the parametric structure is one of a resistor, a capacitor or an inductor. In another embodiment, the parametric structure can be used for a functional purpose, e.g., the parametric structure is a clamped diode. When the parametric structure 240 is a clamped diode, the parametric structure 240 function to protect the IO circuitry from any voltage surges. It should be appreciated that the parametric structure 240 can be represented in an electrical domain as a combination of elements such as resistors, capacitors, inductors or any one of these elements. The transistor 250 gates the logic signal from the parametric structure 240 to the power pin 280. In one embodiment, the transistor 250 is a p-channel metal oxide semiconductor (PMOS) transistor. A gate for the transistor 250 is controlled by an output signal received from the DFT circuitry 220. When the gate is turned on, the logic signal is routed through the parametric structure 240 to the power pin 280. When the gate is turned off, the logic signal is not routed to the power pin 280 as the path is blocked. In one embodiment, when the gate is turned off, no signal will enter the IO pins 290. The details of the DFT circuitry 220 are described in more detail with reference to FIGS. 3A and 3B.

Figures 3A, 3B:
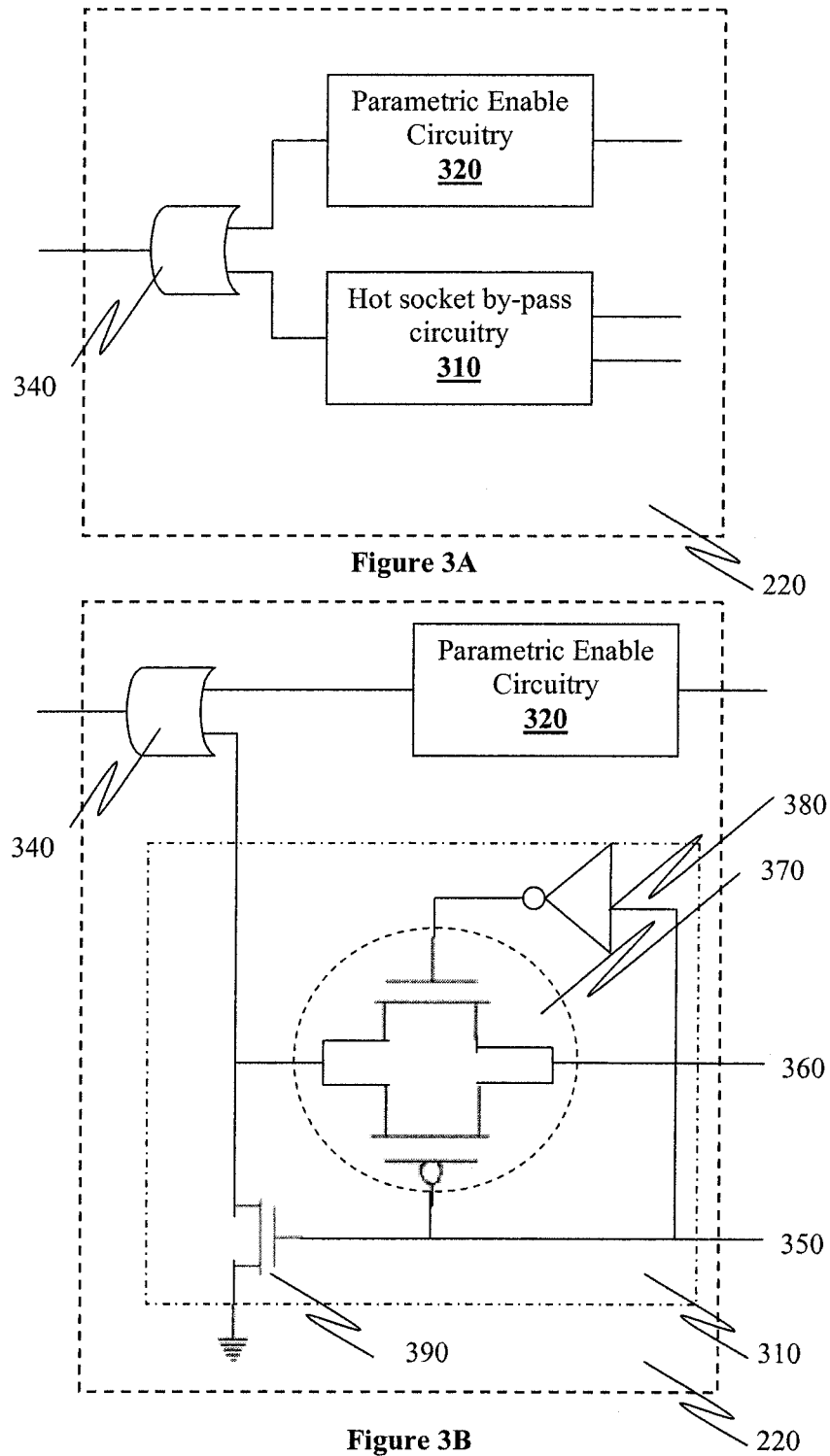
FIG. 3A, meant to be illustrative and not limiting, illustrates details of the Design-For-Test (DFT) circuitry in accordance with one embodiment.
FIG. 3B, meant to be illustrative and not limiting, illustrates details of the hot socket by-pass circuitry in accordance with one embodiment.

FIG. 3A, meant to be illustrative and not limiting, illustrates details of the DFT circuitry. The DFT circuitry 220 includes a parametric enable circuitry 320, a hot socket by-pass circuitry 310 and a logic gate 340. The DFT circuitry 220 provides a control signal to the gate of a transistor 250 of FIG. 2. The control signal either allows or disallows the signal transfer across the transistor 250.

In one embodiment, the logic gate 340 is an OR gate with 2 inputs. One of the inputs is an output from the parametric enable circuitry 320 and the other input is an output of the hot socket by-pass circuitry 310. The control signal is an output from the logic gate 340. In one embodiment, the parametric enable circuitry 320 determines whether to enable functionalities of the parametric structure 240 of FIG. 2. In the embodiment where the parametric structure is a clamped diode the clamped diode is active to provide a protective function for any excessive voltages from entering the IC. However, during testing, the clamped diode is not required and therefore the clamped diode is disabled through the output of the parametric enable circuitry 320. The parametric enable circuitry 320 outputs a signal having a logic level of zero into the logic gate 340, in order to disable the clamped diode during testing. During normal usage or routine chip operation, the parametric enable circuitry 320 outputs a signal having a logic level of one into the logic gate 340. It should be appreciated, the parametric enable circuitry 320 may be programmed to function in a test mode or a normal mode depending on a desired test condition.

Still referring to FIG. 3A, the hot socket by-pass circuitry 310 functions either to by-pass hot socket features or to enable the hot socket features of the IC. The hot socket feature enables the IC to be placed into or removed from a connecting board e.g., a printed circuit board (PCB), without shutting off the power to the board. The connecting board includes a plurality of power sources and a plurality of IO buses. Inserting the IC to the connecting board without a hot socket feature when the connecting board is powered may damage the IC and the connecting board. Another advantage of the hot socket feature is to prevent a signal from being transferred into or out of the IC during a powering sequence. The hot socket feature prevents pulling a logic signal either up or down on the power pin 280 illustrated in FIG. 2. During testing, the hot socket by-pass circuitry 310 is enabled, thereby, disabling the hot socket features and allowing the power pin 280 to be either pulled up or down depending on the test conditions.

FIG. 3B, meant to be illustrative and not limiting, illustrates details of the hot socket by-pass circuitry. The hot socket by-pass circuitry 310 includes a pass gate 370, an inverter 380 and a transistor 390. In one embodiment, the pass gate 370 is composed of an n-channel metal oxide semiconductor (NMOS) transistor and a PMOS transistor arranged in a manner as illustrated in FIG. 3B. There are two inputs to the hot socket by-pass circuitry. A first input 360 carries a hot socket enable signal. A second input 350 carries a hot socket by-pass signal. The transistor 390 is coupled to a grounded connection. A gate of the transistor 390 is controlled by the hot socket by-pass signal of the second input 350. The inverter 380 inverts the hot socket by-pass signal of the second input 350 and couples the inverted hot socket by-pass signal of the second input 350 to the gate of NMOS transistor passgate 390. The PMOS transistor of the pass gate 370 has a gate coupled to the second input 350. When the hot socket by-pass signal is a logic one on the second input 350, the transistor 390 is coupled to ground and the hot socket by-pass circuitry is pulled to ground. When the hot socket by-pass signal is a logic zero on the second input 350, the transistor 390 is disconnected from the ground and the pass gate 370 enables the transfer of the hot socket enable signal through the first input 360.

Figure 4:
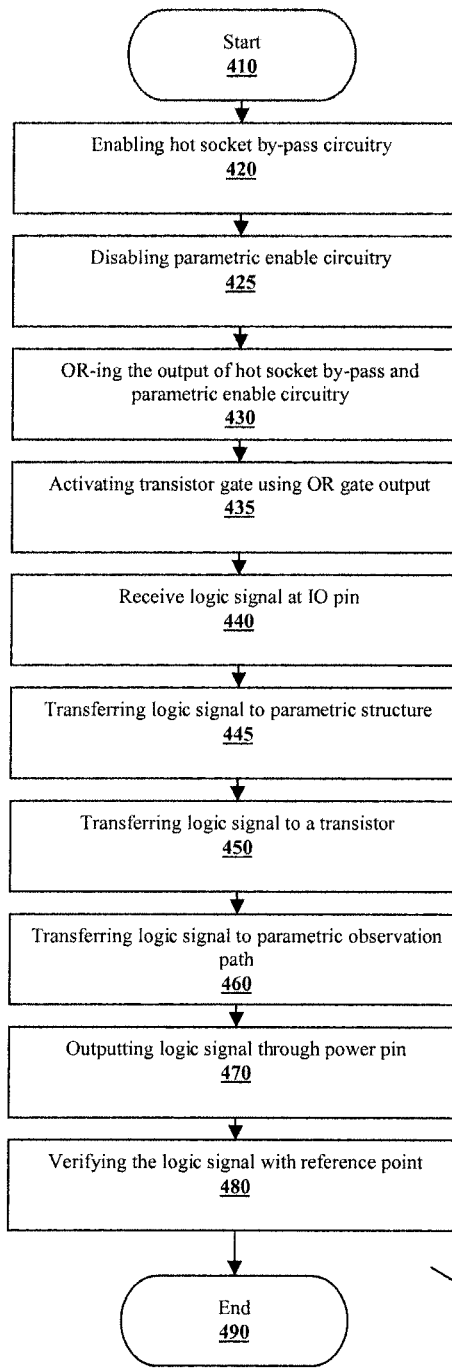
FIG. 4, meant to be illustrative and not limiting, is a flowchart of a method to test a parametric structure utilizing a logical sensing technique in accordance with one embodiment.

FIG. 4, meant to be illustrative and not limiting, is a flowchart of a method to test a parametric structure utilizing a logical sensing technique. The method 400 includes setting the IC in a test environment and testing the parametric structure, as illustrated by the parametric structure 240 in FIG. 2, utilizing the logical sensing technique described herein. Setting the IC into the test environment includes enabling the hot socket by-pass circuitry as in operation 420. Enablement of the hot socket by-pass circuitry allows a logic signal on the power pin, as illustrated by the power pin 280 in FIG. 2, to be either pulled up or pulled down. Next, parametric enable circuitry, as illustrated by the parametric enable circuitry 320 in FIG. 2, is disabled in operation 425. The parametric enable circuitry either enables or disables functionalities of the parametric structure. During testing, the parametric structure functionalities are not utilized. Therefore, the parametric enable circuitry is disabled. During normal usage, the parametric enable circuitry is enabled and the parametric structure functionality is utilized. The output from the hot socket by-pass circuit and the parametric enable circuitry is transferred to an OR gate where the two output signals are logically 'OR'ed as in operation 430. The output from the logically 'OR'ed operation controls signal propagations through the transistor as discussed with reference to FIGS. 2-3B. When one of the outputs from either the parametric enable circuitry or hot socket by-pass circuit is a logic high value, the transistor gate is activated as in operation 435.

Still referring to the flowchart in FIG. 4, the parametric structure testing utilizing the logical sensing technique includes transferring a logic signal to an JO pin as shown in operation 440. The logic signals can be one of a logic one state or logic zero state depending on a test condition to be applied. In one embodiment, a logic one state is applied to the JO pin of the parametric structure. The logic signal is transferred to the parametric structure as in operation 445. In one embodiment the parametric structure is a clamped diode and is tested with a logic one. If the clamped diode is non-defective, then the logic one is transferred across the clamped diode. If the clamped diode is defective, the logic one is not transferred across the clamped diode and the defective condition is identified. In another embodiment, the parametric structure is one of a resistor, a capacitor, an inductor or a combination and tested with the logic one. The logic signal is affected in a voltage domain and/or a current domain. A resistance, capacitance or inductance of the resistor, capacitor or inductor, respectively, affects the logic one in terms of voltage or current level. The logic signal is then transferred from the parametric structure to a transistor that gates the logic signal as in operation 450. The transistor is controlled by an output of the OR gate that is coupled to the gate of the transistor. During testing, the transistor allows signal propagations across the transistor by activating the transistor's gate.

The logic signal is transferred to a pathway that leads to a power pin as in operation 460. The pathway leading to the power pin is illustrated by the pathway 270 as illustrated in FIG. 2. The logic signal is transmitted through the power pin as in operation 470. The logic signal is transferred into a tester hardware, as illustrated by test hardware 120 in FIG. 1, and then into a tester, as illustrated by the tester 110 in FIG. 1. Once the logic signal is transferred to the tester, the logic signal is verified. The voltage level or current level of the logic signal is compared with a reference voltage or current as in operation 480. In one embodiment, the reference voltage of a clamped diode represents the clamped diode in a forward bias condition. In another embodiment, the reference voltage level represents the clamped diode in reverse bias condition. Depending on the comparison result, the parametric structure is declared to be non-defective or defective.

Figure 5:
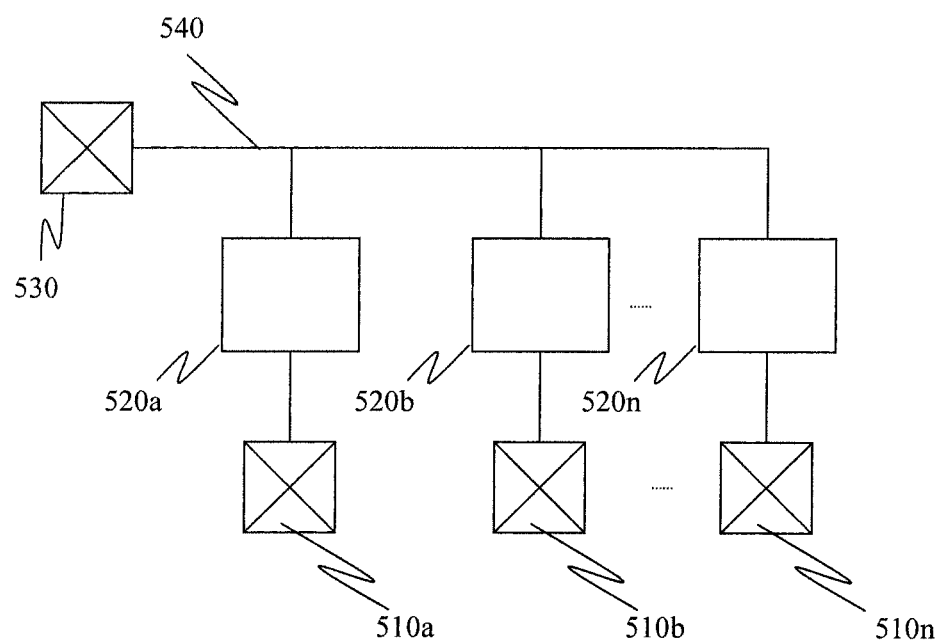
FIG. 5, meant to be illustrative and not limiting, illustrates a simplified schematic of an IC tested through a logical sensing method in accordance with one embodiment.

FIG. 5, meant to be illustrative and not limiting, illustrates a simplified depiction of an IC. The IC includes a power pin 530, a common pathway 540, a plurality of IO pins 510a-510n, and a plurality of parametric structure 520a-520n. Exemplary test results are depicted with an input table (A) and an output table (B).

TABLE A

|  | 510a | 510b | ... | 510n |
|---|---|---|---|---|
| Forward Bias | 1 | X | ... | X |
| Reverse Bias | 1 | 0 | ... | 0 |

TABLE B

|  | Non-defective | Defective |
|---|---|---|
| Forward Bias | 1 | 0 |
| Reverse Bias | 1 | 0 |

Each of the parametric structures 520a-520n is associated with a respective IO pin 510a-510n. The output from each parametric structure is routed to the power pin 530 through a common pathway 540. In one embodiment, the each of the plurality of parametric structures 520a-520n is a clamped diode. In another embodiment, during a forward bias testing of the clamped diodes, a logic one signal is applied to IO pin 510a while the remaining IO pins 510b-510n are left floating, as illustrated in a forward bias row of Table A. If the clamped diode represented by parametric structure 520a is non-defective, the logic one signal is transferred across the clamped diode to the power pin 530 through the common pathway 540, as illustrated in an intersection of a forward bias row and non-defective column of the output Table B. If any of the clamped diode represented by parametric structure 520a is defective, the clamped diode becomes an insulator and blocks the logic one signal transfer to the power pin 530, as illustrated in an intersection of the forward bias row and defective column of the Table B. Next, a logic one signal is transferred from the external source to the IO pin 510b to test the clamped diode that is represented by the parametric structure 520b. The remaining IO pins are left floating. The verification process described above is repeated in a sequential manner for the remainder of the clamped diodes represented by parametric structure 520b-520n.

Still referring to FIG. 5, the reverse bias testing of the clamped diodes is performed by driving a logic one into the IO pin 510a and logic zero into the remaining IO pins 510b-510n as illustrated in a reverse bias row of the input Table A. The clamped diode, represented by parametric structure 520a, is in forward bias. A non-defective group of reverse biased clamped diodes, represented by the parametric structure 520b-520n, blocks the logic signal one from being transferred from the IO pin 510a to one of the IO pins 510b-510n. If the clamped diodes, represented by the parametric structures 520b-520n, are non-defective for reverse bias, the logic signal one from IO pin 510a is transferred through the clamped diode 520a and subsequently to the common pathway 540 and output through power pin 530. This condition is illustrated in an intersection of a reverse bias row and a non-defective column of the Table B. For a defective reverse biased clamped diode represented by either one of the parametric structure 520b-520n, the defective clamped diode creates a shorted path. The logic signal one is transferred from IO pin 510a to the defective clamped diode represented by any one of 520b-520n and outputted and output through the corresponding IO pin. In the case of a defective clamped diode the IO pin 510a is shorted to one of the IO pins that are associated with the defective clamp diode. Due to shorted path, the common pathway 540 carries a logic zero and transfers the logic zero out through power pin 530, as illustrated in an intersection of the reverse bias row and a defective column of the Table B.

Figure 6:
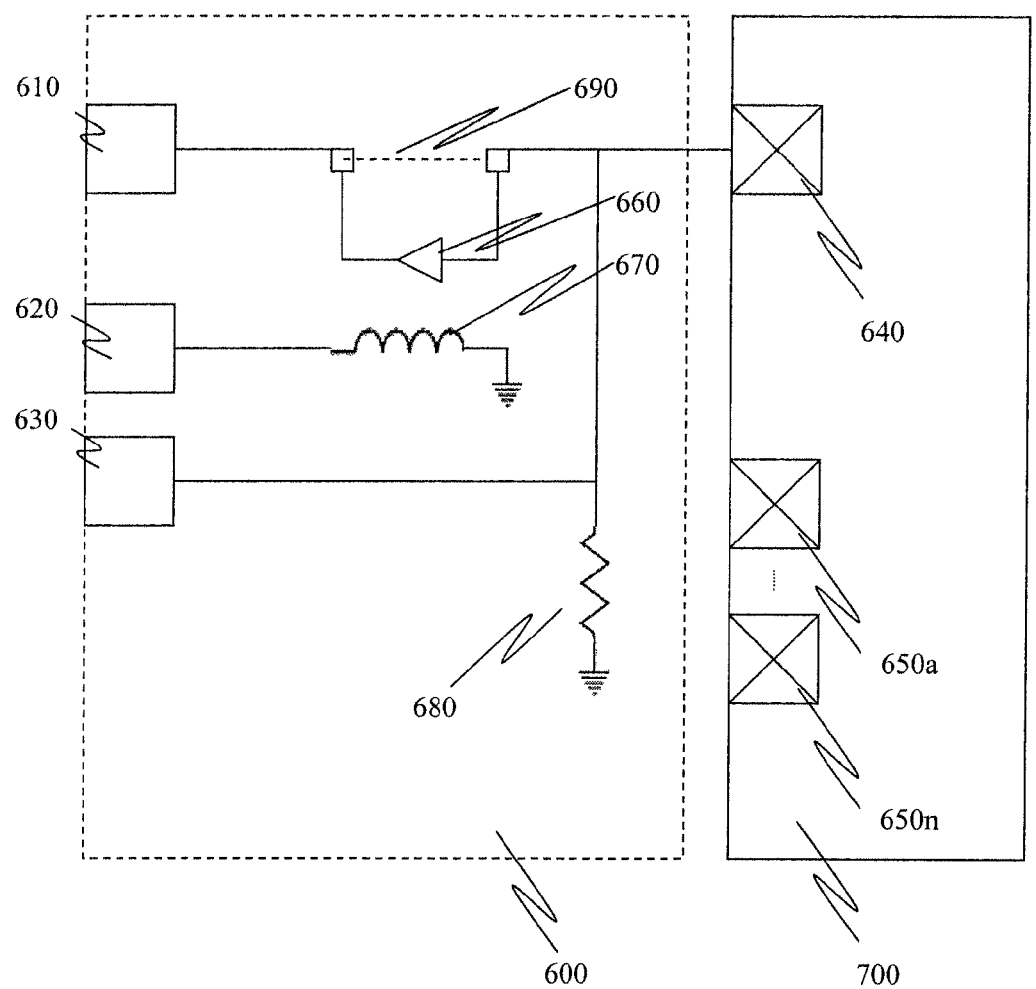
FIG. 6, meant to be illustrative and not limiting, illustrates a system to test a parametric structure on an IC utilizing a logical sensing method in accordance with one embodiment.

FIG. 6, meant to be illustrative and not limiting, illustrates a system to test a parametric structure of an IC utilizing the logical sensing method. The system includes an IC 700 and a test hardware 600. The IC 700 includes a plurality of IO pins 650a-650n and a power pin 640. The test hardware 600 includes a power connector 610, a power enable connector 620, a tester channel 630, a diode 660, an inductor 670, a resistor 680 and a pathway 690. The power pin 640 of the IC 700 is coupled to the power connector 610 of the test hardware 600, if the pathway 690 is established. The diode 660 is coupled to the power connector 610. The power connector 610 provides an interface to a power source from a tester, as illustrated by the tester 110 in FIG. 1. The power connector 610 transfers power from the tester to the power pin 640, if the pathway 690 is established. The power enable connector 620 is coupled to the inductor 670. The power enable connector 620 determines whether to enable or disable transferring power into the power pin 640 in one embodiment. The inductor 670 is coupled to the power enable connector 620 and a ground connection. The diode 660 and the inductor 670 are utilized together as a gate for power transferring from the power connector 610 to the power pin 640 in one embodiment.

In one embodiment, when the inductor 670 is activated, the diode 660 is disabled and the pathway 690 is established. In another embodiment, when the inductor 670 is disabled, the diode 660 is enabled and the pathway 690 is not enabled. The signal from the power enable connector 620 is transferred to the inductor 670. In one embodiment, the tester transmits an enabling signal through the power enable connector 620, activating the inductor 670 which then enables the power transferring into the IC 700. In another embodiment, the tester transmits a disabling signal through the power enable connector 620, disabling the inductor 670 which then disables the power transferring into the IC 700. The latter embodiment is utilized for the purpose of the logical sensing testing for the parametric structure. The tester channel 630 is coupled to the power pin 640 and the resistor 680. In one embodiment, a logic signal that is transferred from the power pin 640 of the IC 700 will be transferred through the tester channel 630 for verification. In another embodiment, the power connector 610 is disabled during the parametric testing utilizing the logical sensing method and the tester channel 630 becomes the pathway for the logic signal to pass through. In one embodiment, the resistor 680 weakly loads the power pin 640 of the IC 700 to the ground. The resistor 680 controls an amount of current that passes through the tester channel 630. In an alternative embodiment, the resistor 680 is replaced with a current source to enable a propagation of a fixed current.

The embodiments, thus far, were described with respect to integrated circuits. The method and apparatus described herein may be incorporated into any suitable circuit. For example, the method and apparatus may be incorporated into numerous types of devices such as microprocessor or programmable logic devices. Exemplary of programmable logic devices include programmable arrays logic(PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method to test a parametric property of an Integrated Circuit (IC), the method comprising:
   receiving a logic signal at an Input Output (IO) pin of the IC;
   transmitting the logic signal to a parametric structure through a path that couples the IO pin to the parametric structure;
   transferring the logic signal through the parametric structure, wherein the parametric structure affects the logic signal in one of a voltage domain or current domain;
   turning on a transistor to enable the logic signal transfer from the parametric structure to a power pin; and
   outputting the logic signal from the power pin.

2. The method in claim 1, wherein a Design-For-Test (DFT) circuitry turns on the transistor when the IC is in a testing mode.

3. The method in claim 1 further comprising:
   activating the hot socket by-pass circuitry that enables transferring of the logic signal during powering sequence.

4. The method in claim 1, further comprising:
   receiving the logic signal in a sequential manner across remaining JO pins to test additional parametric structure.

5. The method in claim 4, wherein the logic signal is one of a digital logic zero or a digital logic one.

6. The method in claim 1, further comprising:
   comparing a value of the logic signal output from the IC with a reference value for the parametric structure within one of the voltage or current domain.

7. The method in claim 1, further comprising receiving additional logic signals into remaining JO pins within the IC, wherein the additional logic signals are opposite in polarity to a polarity of the logic signal received at the JO pin.

8. The method in claim 1, further comprising disabling a power enable signal, wherein the disabling allows propagation of the logic signal into a tester channel.

9. A system to test parametric properties, comprising:
   a device-under-test (DUT), comprising:
      a parametric structure operable to receive and transmit a logic signal;
      a power pin coupled to the parametric structure, wherein the power pin is operable to transfer the logic signal from the DUT; and
      a design-for-test (DFT) circuitry operable to gate the logic signal from the parametric structure to the power pin,
   a tester hardware that interfaces with the DUT and a tester, comprising:
      a channel operable to transfer the logic signal in the DUT;
      a power pathway operable to transfer power to the DUT; and
      a switch operable to enable multiplexing along one of the power pathway or the channel.

10. The system in claim 9, wherein the parametric structure is one of a clamped diode, a resistor, a capacitor or an inductor.

11. The system in claim 9, wherein the tester hardware further comprises a pull down resistor coupled to the channel and ground, wherein a resistance of the pull down resistor determines a testing current of the parametric structure.

12. The system in claim 9, wherein the channel is a current source that sinks current flow within the tester hardware.

13. The system in claim 9, wherein the switch of the tester hardware is operable to be controlled by a power enable signal transferred from the tester.

14. An integrated circuit (IC), comprising:
   a parametric structure operable to receive and transmit a logic signal;
   a power pin coupled to the parametric structure, wherein the power pin is operable to transfer the logic signal from the IC; and
   a design-for-test (DFT) circuitry operable to control a transistor that determines transferring of the logic signal from the parametric structure to the power pin.

15. The IC in claim 14, further comprising an IO pin coupled to the parametric structure, wherein the IO pin is operable to receive the logic signal from an external interface of the IC and to transfer to the parametric structure.

16. The IC in claim 14, wherein the DFT circuitry further comprises:
   a hot socket by-pass circuitry operable to enable transferring the logic signal within the IC during a powering sequence; and
   a parametric enable circuit operable to enable the logic signal to pass through the parametric structure.

17. The IC in claim 16, wherein the hot socket by-pass circuitry comprises:
   a pass gate operable to receive a hot socket signal, wherein the hot socket signal controls the transferring of the logic signal during the powering sequence.

18. The IC in claim 16, wherein outputs from the hot socket by-pass circuitry and the parametric enable circuit are logically combined through as AND gate.

19. The IC in claim 14, wherein the parametric structure is one of a clamped diode, a resistor, a capacitor or an inductor.

20. The IC in claim 14, further comprising a plurality of parametric structures, wherein each the plurality of parametric structures is coupled to the power pin.

* * * * *